United States Patent
Yang (10) Patent No.: US 8,670,081 B2
(45) Date of Patent: Mar. 11, 2014

(54) ARRAY SUBSTRATE FOR LIQUID CRYSTAL DISPLAY DEVICE AND METHOD OF FABRICATING THE SAME

(75) Inventor: Joon-Young Yang, Gyeonggi-do (KR)

(73) Assignee: LG Display Co. Ltd., Seoul (KR)

( * ) Notice: Subject to any disclaimer, the term of this patent is extended or adjusted under 35 U.S.C. 154(b) by 104 days.

(21) Appl. No.: 11/881,167

(22) Filed: Jul. 25, 2007

(65) Prior Publication Data
US 2008/0087886 A1    Apr. 17, 2008

(30) Foreign Application Priority Data
Oct. 16, 2006  (KR) .................. 10-2006-0100361

(51) Int. Cl.
| G02F 1/136 | (2006.01) |
|---|---|
| G02F 1/1333 | (2006.01) |
| H01L 51/40 | (2006.01) |
| H01L 21/00 | (2006.01) |
| H01L 21/84 | (2006.01) |
| H01L 29/08 | (2006.01) |
| H01L 35/24 | (2006.01) |
| H01L 51/00 | (2006.01) |

(52) U.S. Cl.
USPC .................. 349/43; 349/56; 438/99; 438/149

(58) Field of Classification Search
USPC .......... 349/56, 140, 43; 438/142, 149, 82, 99, 438/780; 257/347, E51.005, 40, 213, 288, 257/E29.151, E51.001, E51.004, 642, 643
See application file for complete search history.

(56) References Cited

U.S. PATENT DOCUMENTS

| 5,905,548 | A * | 5/1999 | Shimada .......................... 349/38 |
|---|---|---|---|
| 5,981,317 | A * | 11/1999 | French et al. ................. 438/161 |
| 6,635,508 | B2 * | 10/2003 | Arai et al. ....................... 438/99 |
| 6,717,631 | B2 * | 4/2004 | Choi .............................. 349/43 |
| 6,738,108 | B2 * | 5/2004 | Ohta et al. ..................... 349/39 |
| 6,794,220 | B2 * | 9/2004 | Hirai et al. ..................... 438/99 |
| 6,894,736 | B2 * | 5/2005 | Battersby et al. .............. 349/42 |
| 6,970,222 | B2 * | 11/2005 | Nakayoshi et al. ........... 349/139 |
| 7,230,267 | B2 * | 6/2007 | Nagayama et al. ............ 257/40 |
| 7,288,818 | B2 * | 10/2007 | Lee et al. ...................... 257/347 |
| 7,364,940 | B2 * | 4/2008 | Kim et al. ...................... 438/99 |
| 7,485,507 | B2 * | 2/2009 | Ahn et al. ..................... 438/153 |

(Continued)

FOREIGN PATENT DOCUMENTS

| KR | 1020010101885 A | 11/2001 |
|---|---|---|
| KR | 1020050070479 A | 7/2005 |

(Continued)

Primary Examiner — Mark Robinson
Assistant Examiner — Robert Tavlykaev
(74) Attorney, Agent, or Firm — Brinks Gilson & Lione (57) ABSTRACT

An array substrate for a liquid crystal display device includes a data line formed on a substrate including a pixel region; a source electrode extending from the data line; a drain electrode separated from the source electrode; a pixel electrode contacting the drain electrode and formed of a transparent conductive material in the pixel region; an organic semiconductor layer on the source and drain electrodes; a first gate insulating layer of an organic insulating material on the organic semiconductor layer; a second gate insluting layer of an inorganic insulating material on entire surface of the substrate including the first gate insulating layer; a gate line formed on the second gate insulating layer and crossing the data line to define the pixel region; and a gate electrode on the second gate insulating layer extending from the gate line and corresponding to the organic semiconductor layer.

8 Claims, 6 Drawing Sheets

(56) References Cited

U.S. PATENT DOCUMENTS

| | | | |
|---|---|---|---|
| 7,489,368 B2* | 2/2009 | Kim et al. | 349/43 |
| 7,515,216 B2* | 4/2009 | Song | 349/39 |
| 2001/0013908 A1* | 8/2001 | Gu et al. | 349/43 |
| 2002/0012080 A1* | 1/2002 | Ishihara et al. | 349/43 |
| 2002/0071075 A1* | 6/2002 | Ogino et al. | 349/113 |
| 2002/0126243 A1* | 9/2002 | Hibino et al. | 349/122 |
| 2003/0052846 A1* | 3/2003 | Yoshihara et al. | 345/87 |
| 2003/0059987 A1* | 3/2003 | Sirringhaus et al. | 438/149 |
| 2004/0007704 A1* | 1/2004 | Kim | 257/59 |
| 2005/0140840 A1* | 6/2005 | Hirakata et al. | 349/43 |
| 2006/0160280 A1* | 7/2006 | Suh et al. | 438/149 |
| 2006/0222971 A1* | 10/2006 | Seo et al. | 430/7 |
| 2007/0120116 A1* | 5/2007 | Han | 257/40 |

FOREIGN PATENT DOCUMENTS

| | | | | |
|---|---|---|---|---|
| KR | 1020060026244 A | 3/2006 | | |
| WO | WO 02/91064 A2 * | 5/2002 | | |
| WO | WO 2006/062217 A1 * | 12/2005 | | H01L 29/786 |

* cited by examiner

ARRAY SUBSTRATE FOR LIQUID CRYSTAL DISPLAY DEVICE AND METHOD OF FABRICATING THE SAME

The present application claims the benefit of Korean Patent Application No. 2006-0100361, filed in Korea on Oct. 16, 2006, which is hereby incorporated by reference.

TECHNICAL FIELD

The present application relates to a liquid crystal display (LCD) device and, more particularly, to an array substrate for the LCD device having a semiconductor layer of an organic semiconductor material.

BACKGROUND

Since a liquid crystal display (LCD) device has characteristics of light weight, thinness and low power consumption, LCD devices have been widely used as a substitute for cathode rat tube (CRT) devices.

The LCD device uses the optical anisotropy and polarization properties of liquid crystal molecules to display images. The liquid crystal molecules have orientation characteristics resulting from their thin and long shape. An arrangement direction of the liquid crystal molecules can be controlled by applying an electrical field to the molecules. The LCD device including a thin film transistor (TFT) as a switching element is referred to as an active matrix LCD (AM-LCD) device, and has characteristics of high resolution and displaying moving images. Since the LCD device includes the TFT as the switching element, it may be referred to a TFT-LCD device.

Figure 1:
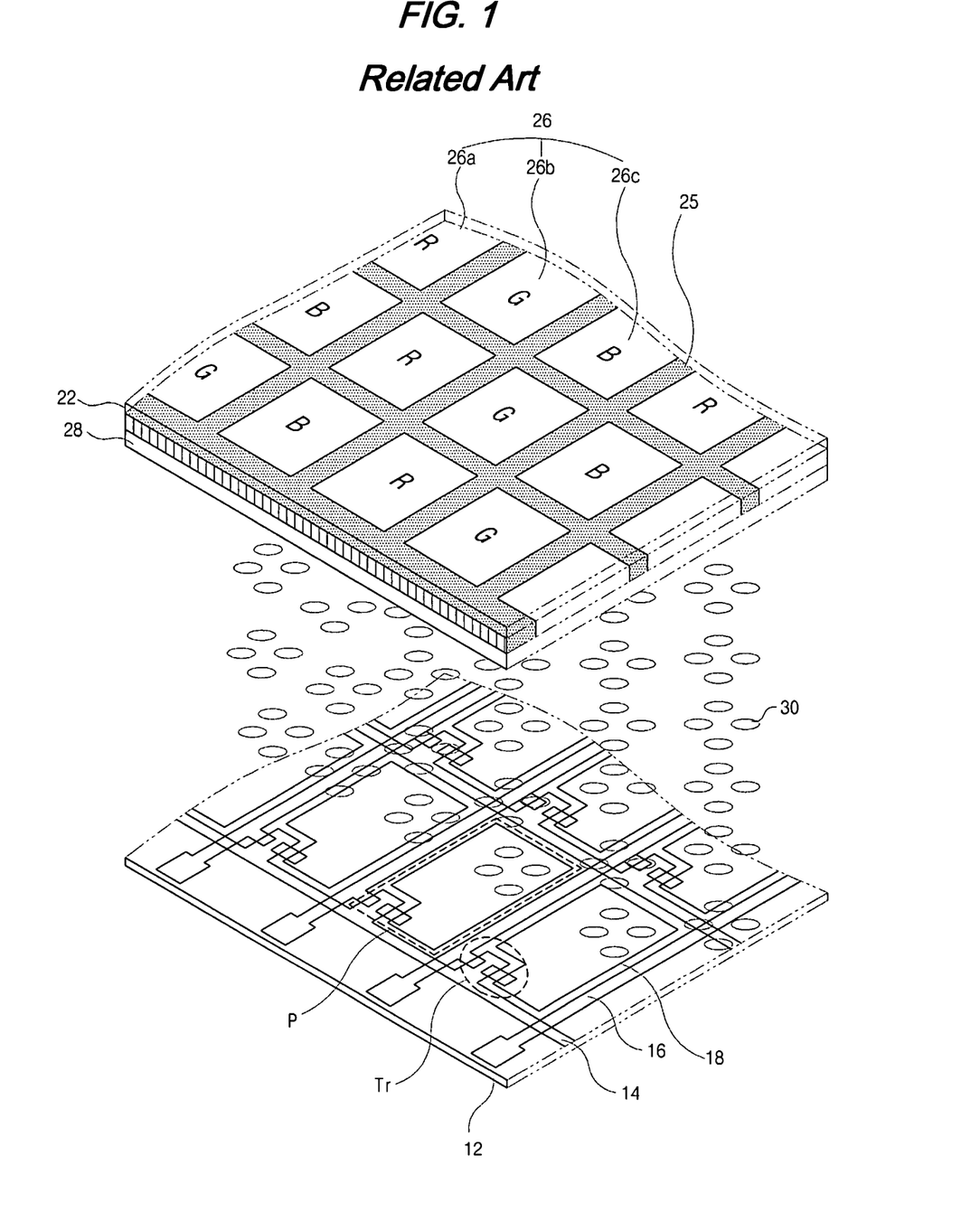
FIG. 1 is an exploded perspective view of a conventional LCD device.

FIG. 1 is an exploded perspective view of a conventional LCD device. The LCD device includes first and second substrates 12 and 22, and a liquid crystal layer 30. The first and second substrates 12 and 22 face each other, and the liquid crystal layer 30 is interposed therebetween.

The first substrate 12 includes a gate line 14, a data line 16, a TFT "Tr", and a pixel electrode 18. The gate line 14 and the data line 16 cross each other such that a region is formed between the gate and data lines 14 and 16 and is defined as a pixel region "P". The TFT "Tr" is formed at a crossing portion between the gate and data lines 14 and 16, and the pixel electrode 18 is formed in the pixel region "P" and connected to the TFT "Tr".

The second substrate 22 includes a black matrix 25, a color filter layer 26, and a common electrode 28. The black matrix 25 has a lattice shape to cover a non-display region of the first substrate 12, such as the gate line 14, the data line 16, the TFT "Tr". The color filter layer 26 includes first, second, and third sub-color filters 26a, 26b, and 26c. Each of the sub-color filters 26a, 26b, and 26c has one of red, green, and blue colors "R", "G", and "B" and corresponds to the each pixel region "P". The common electrode 28 is formed on the black matrix 25 and the color filter layers 26 and over an entire surface of the second substrate 22. As mentioned above, the arrangement of the liquid crystal molecules is controlled by an electric field between the pixel electrode 18 and the common electrode 28 such that an amount of transmitted light is changed. As a result, the LCD device displays images.

Though not shown in FIG. 1, to prevent the liquid crystal layer 30 from leaking, a seal pattern may be formed along edges of the first and second substrates 12 and 22. First and second alignment layers may be formed between the first substrate 12 and the liquid crystal layer 30 and between the second substrate 22 and the liquid crystal layer 30. A polarizer may be formed on an outer surface of the first and second substrates 12 and 22.

An LCD device includes a backlight assembly opposing an outer surface of the first substrate 12 to supply light to the liquid crystal layer 30. When a scanning signal is applied to the gate line 14 to control the TFT "Tr", a data signal is applied to the pixel electrode 18 through the data line 16 such that the electric field is induced between the pixel and common electrodes 18 and 28. As a result, the LCD device produces images using the light from the backlight assembly.

Generally, a glass plate is used for the first and second substrates 12 and 22. However, recently, a flexible plate, such as a plastic plate, is used for the first and second substrates 12 and 22 because the flexible plate is lighter and more flexible than the glass plate.

However, since a process of fabricating an array substrate is performed under a temperature higher than about 200° C., it is difficult for the flexible plate to be substituted for the glass plate. When the semiconductor layer is formed of one of amorphous silicon and polycrystalline silicon under a lower temperature than about 200° C., properties of the TFT are deteriorated. So, the array substrate is made of the glass substrate, and the color filter substrate is made of the flexible substrate.

SUMMARY

An array substrate for an LCD device and a method of fabricating the same that has an organic semiconductor layer without substantial deterioration by next following manufacturing processes and a sufficient storage capacitance with a thinner dielectric material layer is described.

An array substrate for a liquid crystal display device includes a data line formed on a substrate including a pixel region; a source electrode extending from the data line; a drain electrode separated from the source electrode; a pixel electrode contacting the drain electrode and formed of a transparent conductive material in the pixel region; an organic semiconductor layer on the source and drain electrodes; a first gate insulating layer of an organic insulating material on the organic semiconductor layer; a second gate insulting layer of an inorganic insulating material on entire surface of the substrate including the first gate insulating layer; a gate line formed on the second gate insulating layer and crossing the data line to define the pixel region; and a gate electrode on the second gate insulating layer extending from the gate line and corresponding to the organic semiconductor layer.

In another aspect, a method of fabricating an array substrate for a liquid crystal display device is described, including forming a data line, a source electrode and a drain electrode on a substrate including a pixel region. The source electrode extends from the data line, and the source electrode and drain electrode are separated from each other; forming a pixel electrode of a transparent conductive material contacting the drain electrode and disposed in the pixel region. An organic semiconductor layer is formed on the source and drain electrode; and a first gate insulating layer of an organic insulating material is formed on the organic semiconductor layer. A second gate insulating layer of an inorganic insulating material is formed on the entire surface of the substrate including the first gate insulating layer; and a gate line and a gate electrode is formed on the second gate insulating layer. The gate line crosses the data line to define the pixel region, and the gate electrode extends from the gate line.

DETAILED DESCRIPTION

Exemplary embodiments may be better understood with reference to the drawings, but these examples are not intended to be of a limiting nature. Like numbered elements in the same or different drawings perform equivalent functions.

A an array substrate and a method of fabricating the array substrate under a temperature lower than about 200° C. by forming the TFT from an organic semiconductor material on the flexible substrate is described. Since the organic semiconductor material can be formed by coating instead of vacuum depositing, the production cost is reduced, and the flexible plate may be used for not only the plastic plate but also the glass plate.

A metal material for electrodes, an insulating material and a passivation layer may be formed on the flexible substrate by one of low-temperature deposition and coating. These methods do not deleteriously affect the properties of the TFT. However, when the semiconductor layer is formed of amorphous silicon under a lower temperature than about 200° C., there are problems, for example, of conductivity. To overcome these problems, the semiconductor layer is formed of the organic semiconductor material instead of the amorphous silicon.

Organic semiconductor material may be divided into a high molecular weight organic semiconductor material and a low molecular weight organic semiconductor material. The high molecular weight organic semiconductor material may be a liquid phase type, and the low molecular weight organic semiconductor material may be a powder type. The organic semiconductor layer may be formed from the high molecular weight organic semiconductor material by coating and from the low molecular weight organic semiconductor material by evaporation.

The low molecular weight organic semiconductor properties, may be used for the semiconductor layer as a substitute of the amorphous silicon. However, the low molecular weight organic semiconductor material is evaporated by using a vacuum machine which may be expensive. A low molecular weight organic semiconductor material of the powder type maybe patterned by not a shadow mask process, which may not effectively form delicate patterns. Accordingly, a low molecular weight organic semiconductor material of the liquid phase type is may be useful for the LCD device. However, the low molecular weight organic semiconductor material of the liquid phase type is used for the semiconductor layer, may be deteriorated by a stripper for a photoresist.

The organic semiconductor material may have some limitations as an insulating layer. However, if an inorganic insulating material is deposited for the insulating layer on the organic semiconductor layer, the organic semiconductor layer may deteriorated by the deposition process. Accordingly, when the semiconductor layer is formed from the organic semiconductor material, an organic insulating material may be used for the insulating layer. However, the insulating layer of the organic insulating material has a greater thickness than that of the inorganic insulating material, and the storage capacitance for storage electrodes having the same areas is reduced.

Figure 2:
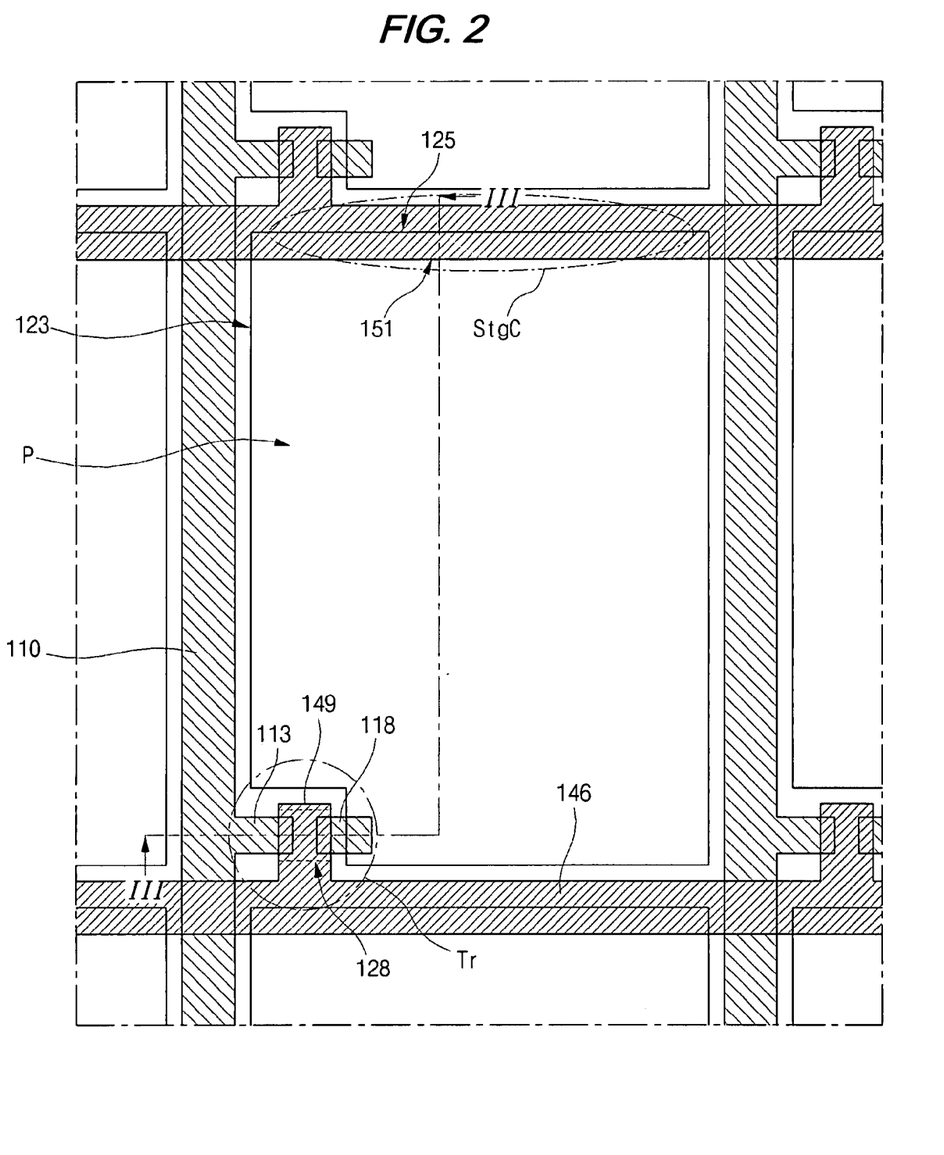
FIG. 2 is a plane view of one pixel region of an array substrate for a LCD device including an organic semiconductor layer.

FIG. 2 is a plane view of a pixel region of an array substrate for a LCD device. Gate and data lines 146 and 110, the TFT "Tr", a pixel electrode 123 and a storage capacitor "StgC" are formed on a substrate 101. The substrate 101 may be one of a glass plate or plastic plate. The gate and data lines 146 and 110 cross each other to define a pixel region "P". The TFT "Tr" is formed at crossing portion of the gate and data line 146 and 110 and connected to the pixel electrode 123. The TFT "Tr" includes source and drain electrodes 113 and 118, a gate electrode 149 and an organic semiconductor layer 128. The source electrode 113 extends from the data line 110 and is separated from the drain electrode 118. The organic semiconductor layer 128 is formed on the source and drain electrodes 113 and 118. The gate electrode 149 extends from the gate line 146 and is formed over the organic semiconductor layer 128. The pixel electrode 123 is connected to the drain electrode 118 and formed of a transparent conductive material.

The pixel electrode 123 overlaps a previous gate line 146 such that a portion of the pixel electrode 123 and a portion of the previous gate line 146 are defined as first and second storage electrodes 125 and 151. The first and second storage electrodes 125 and 151, and an insulating layer interposed therebetween constitute the storage capacitor "StgC".

Figure 3:
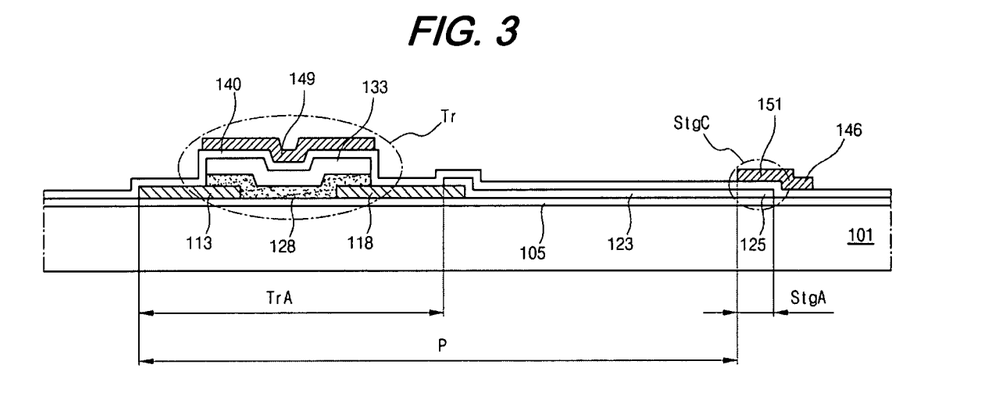
FIG. 3 is a cross-sectional view taken along the line III-III of FIG. 2.

FIG. 3 is a cross-sectional view taken along the line III-III of FIG. 2.

For convenience of explaining the example, a region in which an organic TFT "Tr" is to be formed, is defined as a switching region "TrA", and another region, in which the a storage capacitor "StgC" is to be formed, is defined as a storage region "StgA".

A buffer layer 105 of a first inorganic insulating material is formed on the substrate 101. The first inorganic insulating material may be, for example, silicon oxide which has excellent hydrophilic properties. Alternatively, the buffer layer 105 may be omitted. The source and drain electrodes 113 and 118, and the data line (not shown) are formed on the buffer layer 105 by depositing and patterning a first metal material. The data line (not shown) is formed along a first direction. The source and drain electrodes 113 and 118 are formed in the switching region "TrA".

The pixel electrode 123 of a transparent conductive material is formed in the pixel region "P" and the storage region "StgA" on the buffer layer 105. The pixel electrode 123 contacts the drain electrode 118. The pixel electrode formed in the storage region "StgA" is defined the first storage electrode 125. The organic semiconductor layer 128 of a liquid phase organic semiconductor material is formed in the switching region "TrA". The semiconductor layer 128 partially covers the source and drain electrodes 113 and 118 and a portion between the source and drain electrodes 113 and 118.

A first gate insulating layer 133 of an organic insulating material is formed on the organic semiconductor layer 128. The first gate insulating layer 133 has a same shape as the organic semiconductor layer 128. A second gate insulating layer 140 of a second inorganic insulating material is formed on the first gate insulating layer 133 and the pixel electrode 123. The second inorganic insulating material may include one of silicon oxide or silicon nitride.

The gate line 146 and the gate electrode 149 are formed on the second gate insulating layer 140. The gate line 146 is formed along a second direction such that the gate line 146 crosses the data line (not shown) to define the pixel region "P". The gate electrode 149 extends from the gate line 146 into the switching region "TrA". The gate line in the storage region "StgA" is defined as the second storage electrode 151. The first and second storage electrodes 125 and 151, and the second gate insulating layer 140 as a dielectric material layer comprise the storage capacitor "StgC". The source and drain electrodes 113 and 118, the organic semiconductor layer 128, the first and second gate insulating layer 133 and 140, and the gate electrode 149 comprise the organic TFT "Tr".

The storage capacitor "StgC" includes the dielectric material layer of the second inorganic material instead of an organic material. The dielectric material layer of the inorganic material has a lower thickness than that of the organic material. The storage capacitance is inversely proportional to a thickness of the dielectric material layer and proportional to the areas of the first and second storage capacitor. Accordingly, the storage capacitor having the dielectric material layer of the inorganic material may have greater storage capacitance than a storage capacitor having the dielectric material layer of the organic material with the same areas of the first and second storage electrodes.

Although not shown, a passivation layer may be formed on the gate line 146 and the gate electrode 149 by coating an organic insulating material or depositing an inorganic insulating material. The gate line 146 and the gate electrode 149 are exposed and may be corroded without the passivation layer.

FIGS. 4A to 4I are cross-sectional views showing steps in a manufacturing process for fabricating a substrate for a LCD device including an organic semiconductor layer.

Figure 4A:
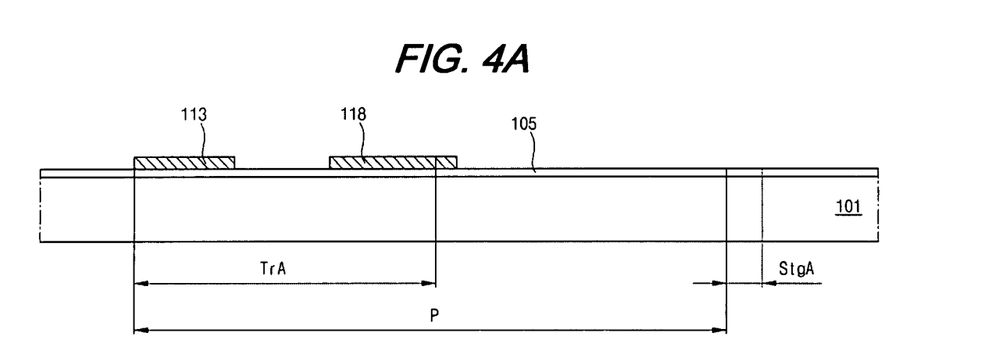
FIGS. 4A to 4I are cross-sectional views showing processes for fabricating a substrate for a LCD device including an organic semiconductor layer.

As shown in FIG. 4A, the buffer layer 105 is formed on the substrate 101 by depositing the first inorganic insulating material. The first inorganic insulating material, such as silicon oxide, may have excellent hydrophilic properties and suitable adhesive properties with respect to the substrate 101, an organic material and a metal material. The organic semiconductor layer has a uniform thickness and continuity due to the buffer layer 105. Alternative, the buffer layer 105 may be omitted.

The data line (not shown), the source electrode 113 and the drain electrode 118 are formed on the buffer layer 105 by depositing and patterning the first metal material using a first mask process. The first metal material includes one of gold (Au), copper (Cu), copper alloy, aluminum (Al), or aluminum alloy (AlNd). The first mask process includes steps of coating a photoresist (PR), exposing the PR using a mask, developing the PR, etching the first metal material layer, and stripping the PR. The data line (not shown) is formed along the first direction, and the source electrode 113 extends from the data line (not shown). The source and drain electrode 113 and 118 are formed in the switching region "TrA" and are separated from each other.

Figure 4B:
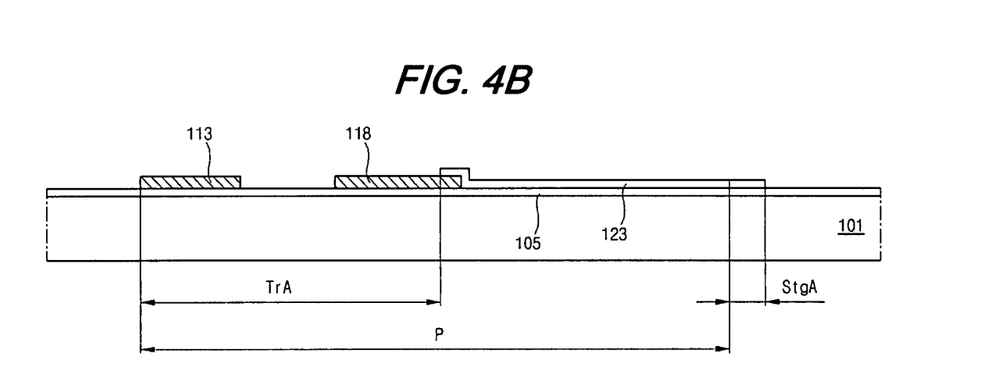

Next, as shown in FIG. 4B, the pixel electrode 123 is formed in the pixel region "P" by depositing and patterning the transparent conductive material using a second mask process. The transparent conductive material includes one of indium-tin-oxide (ITO) or indium-zinc-oxide (IZO). The pixel electrode 123 contacts the drain electrode 118 and extends to the storage region "StgA".

Figure 4C:
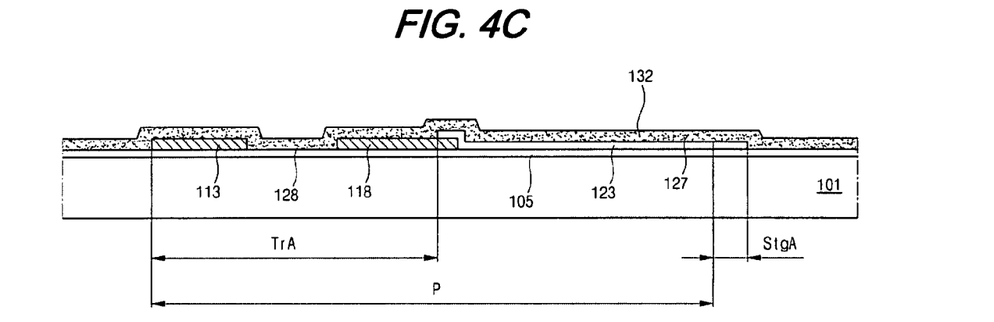

Next, as shown in FIG. 4C, an organic semiconductor material layer 127 is formed on the source electrode 113, the drain electrode 118 and the pixel electrode 123 by coating a liquid phase organic semiconductor material having a good mobility, such as pentacene or polythiophene. The liquid phase organic semiconductor material is coated by using one of an inkjet coating machine, a nozzle coating machine, a bar type coating machine, a slit type coating machine, a spin coating machine, or a printing machine.

Figure 4D:
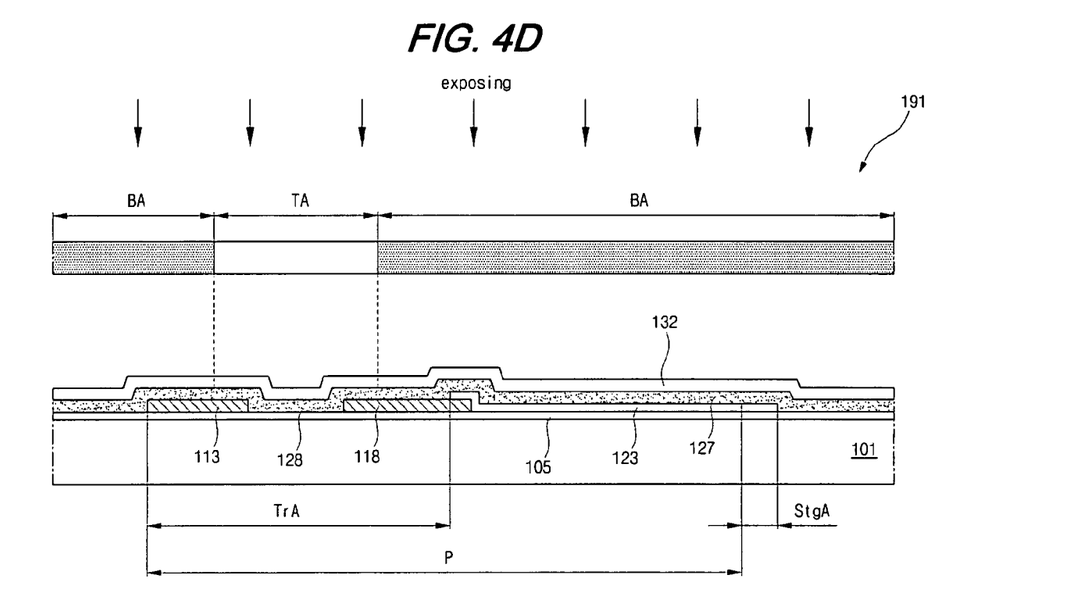

Next, as shown in FIG. 4D, a gate insulating material layer 132 is formed on the organic semiconductor material layer 127 by coating the organic insulating material having photosensitive properties, such as photo-acryl or polyvinylalcohol (PVA).

Then, a mask 191, which has a blocking area BA and a transmissive area "TA", is disposed over the gate insulating material layer 132, and the gate insulating material layer 132 is exposed. In this example, the organic insulating material is a negative type, and the transmissive area "TA" corresponds to the switching region "TrA".

Figure 4E:
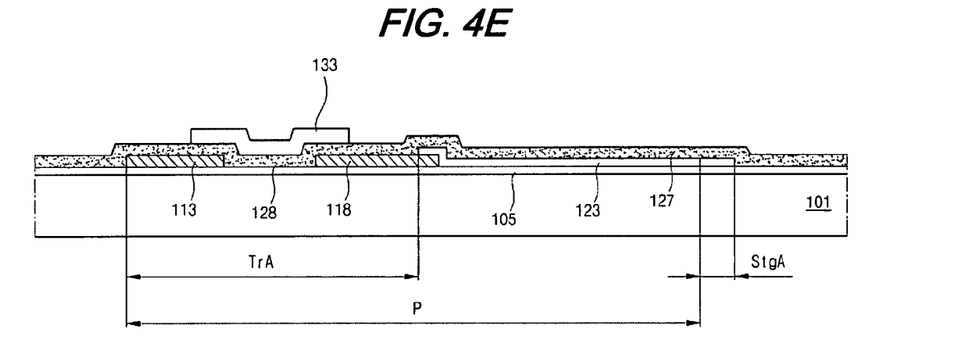

Next, as shown in FIG. 4E, the first gate insulating layer 133 is formed on the organic semiconductor material layer 127 by etching the gate insulating material layer 132 using a developer. The first gate insulating layer 133 corresponds to the switching region "TrA" such that the organic semiconductor material layer 127 in the other regions is exposed. Potassium hydroxide (KOH) may be used for photo-acryl as the developer, and deionized water (DI) may be used for PVA as the developer. Since KOH and DI do not affect the organic semiconductor material layer 127, the organic semiconductor material layer 127 may not be deteriorated by the developer.

Figure 4F:
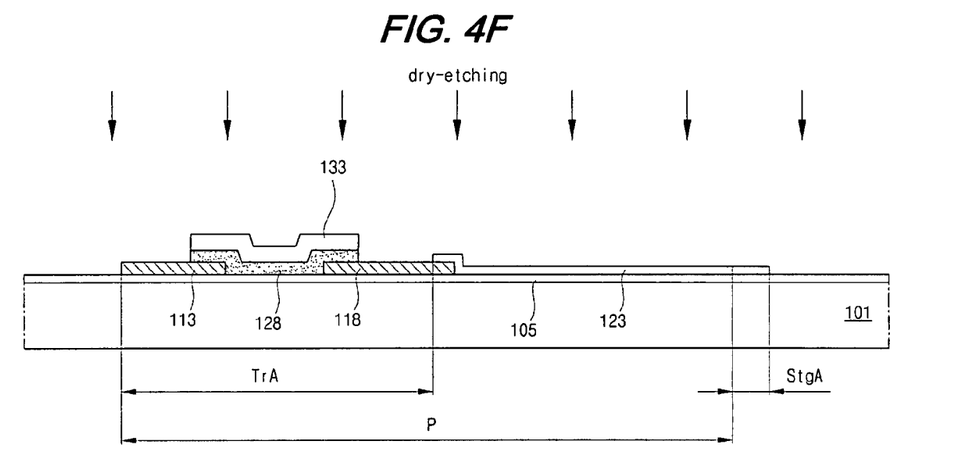

Next, as shown in FIG. 4F, the organic semiconductor layer 128 is formed in the switching region "TrA" by dry-etching the organic semiconductor material layer 127 (of FIG. 4E) using the first gate insulating layer 133 as a mask. The organic semiconductor layer 128 has a same shape as the first gate insulating layer 133. As a result, the pixel electrode 123 in the storage region "StgA" and the pixel region "P" except for the switching region "TrA" is exposed.

Figure 4G:
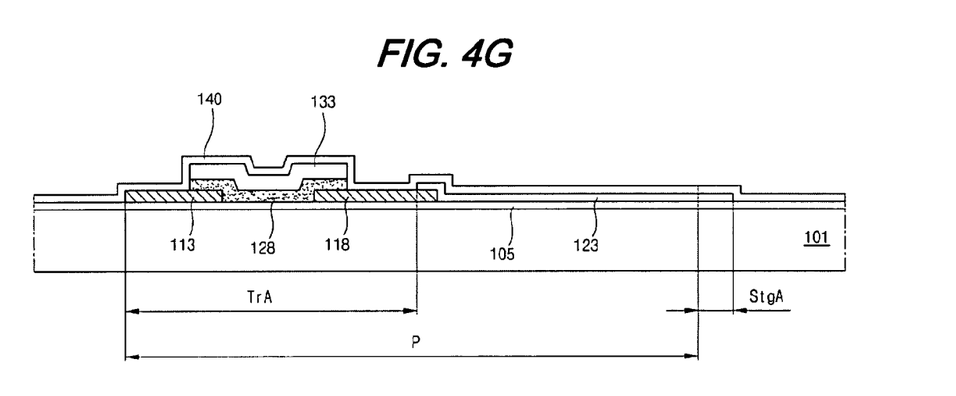

Next, as shown in FIG. 4G, the second gate insulating layer 140 is formed on the first gate insulating layer 133 and the pixel electrode 123 by depositing the second inorganic insulating material, such as silicon oxide and silicon nitride. Since the second gate insulating layer 140 is formed of the inorganic insulating material and the first gate insulating layer 133 is formed of the organic insulating material, the second gate insulating layer 140 may be thinner than the first gate insulating layer 133. Moreover, since the second gate insulating layer 140 covers an entire surface of the substrate 101 including the semiconductor layer 128, the semiconductor layer 128 may not be affected by next processes.

Figure 4H:
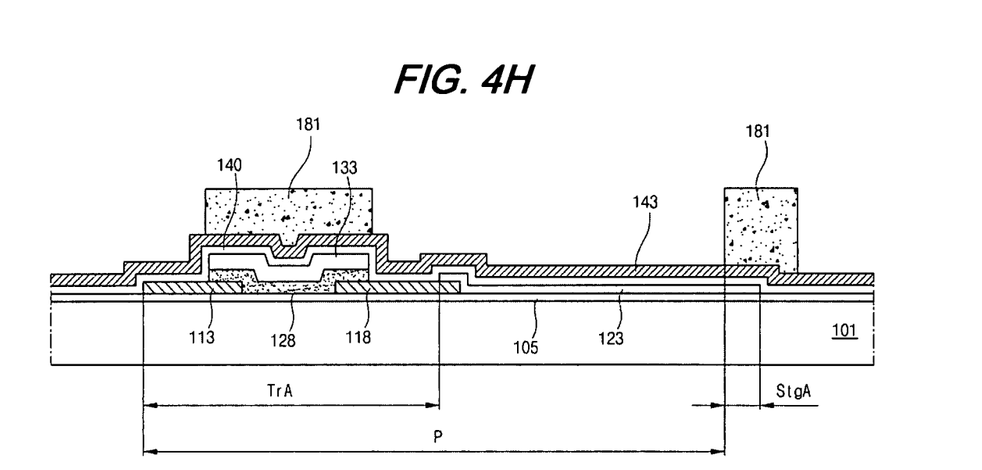

Next, as shown in FIG. 4H, a metal layer 143 is formed on the second insulating layer 140 by depositing a second metal material having low resistance properties, such as Au, Cu, copper alloy, Al, or AlNd. Subsequently, a PR layer (not shown) is formed on the metal layer 143. Then, the PR layer is exposed and developed using a mask and a developer to form a PR pattern 181 in regions in which the gate line and the gate electrode are to be formed. Since the gate insulator layer 140 covers the semiconductor layer 128, the semiconductor layer 128 is not exposed by the developer for the PR. The PR pattern 181 corresponds to the switching region "TrA" and the storage region "StgA".

Figure 4I:
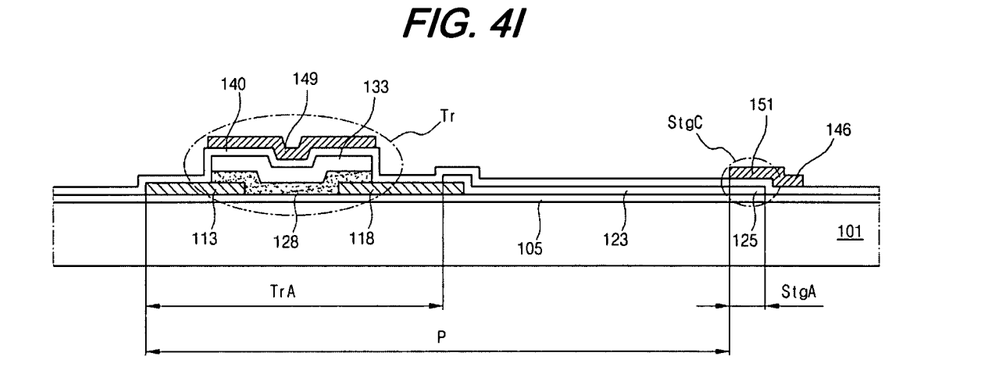

Next, as shown in FIG. 4I, the gate line 146 and the gate electrode 149 are formed on the second gate insulating layer 140 by patterning the metal layer 143 (of FIG. 4H) using the PR pattern 181 (of FIG. 4H) as a pattering mask. The gate line 146 is formed along the second direction such that the gate line 146 crosses the data line (not shown) to define the pixel region "P". The gate electrode 149 is formed in the switching region "TrA". The source and drain electrodes 113 and 118, the organic semiconductor layer 128, the first and second gate insulating layers 133 and 140, and the gate electrode 149 comprise the TFT "Tr". Moreover, the gate line in the storage region "StgA" is defined as the second storage electrode 151. The second storage electrode 151 overlaps the first storage electrode 125. The first storage electrode 125 extends from the pixel electrode 123 into the storage region "StgA". The first and second storage electrodes 125 and 151, and the second gate insulating layer 140 interposed therebetween comprise the storage capacitor "StgC".

Although not shown, a passivation layer may be formed on the gate line 146 and gate electrode 149 by coating an organic insulating material, such as photo-acryl, PVA, orbenzocyclobutene (BCB), and depositing an inorganic insulating material, such as silicon oxide and silicon nitride. The passivation layer may prevent the gate line 146 and the gate electrode 149 being corroded.

The second gate insulating layer 140 of the inorganic insulating material is much thinner that the first gate insulating layer 133 of the organic insulating material. Accordingly, the storage capacitor "StgC", which includes the second gate insulating layer 140 as the dielectric material layer, has a greater storage capacitance when compared with the same areas of the first and second storage electrodes 125 and 151. When the storage capacitor includes the dielectric material layer of the organic insulating material, the storage electrodes should have greater areas for the same storage capacitance as the storage capacitor and may result in a reduced aperture ratio. Thus, the storage capacitor in the present invention may have improved storage capacitance and aperture ratio. While the method disclosed herein has been described and shown with reference to particular steps performed in a particular order, it will be understood that these steps may be combined, sub-divided, or reordered to from an equivalent method without departing from the teachings of the present invention. Accordingly, unless specifically indicated herein, the order and grouping of steps is not a limitation of the present invention.

Although the present invention has been explained by way of the embodiments described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An array substrate for a liquid crystal display device, comprising:
   a data line formed on a substrate;
   an organic thin film transistor (TFT) that includes an organic material as a semiconductor material, the organic TFT comprising:
      a source electrode extending from the data line;
      a drain electrode separated from the source electrode;
      an organic semiconductor layer on the source and drain electrodes and made of the organic material;
      a first gate insulating layer of an organic insulating material on the organic semiconductor layer and covering an upper surface of the organic semiconductor layer;
      a second gate insulating layer of an inorganic insulating material formed on an entire surface of the substrate including the first gate insulating layer such that the first gate insulating layer is formed between the organic semiconductor layer and the second gate insulating layer; and
      a gate electrode on the second gate insulating layer;
   a gate line formed on the second gate insulating layer and crossing the data line to define the pixel region, the gate electrode extending from the gate line and overlaying the organic semiconductor layer, wherein the second gate insulating layer contacts the side surface of the organic semiconductor layer;
   a pixel electrode contacting the drain electrode and formed of a transparent conductive material in a pixel region; and
   a storage capacitor comprising
      storage electrodes formed by overlapping portions of the gate line and the pixel electrode, and
      a dielectric material between the storage electrodes, wherein the second gate insulating layer extends from the first gate insulating layer, and is disposed between and in direct contact with the storage electrodes such that the dielectric material is formed by only the inorganic insulating material, and
   wherein the second gate insulating layer is thinner than the first gate insulating layer, and wherein the inorganic insulating material for the second gate insulating layer has a dielectric constant larger than the organic insulating material for the first gate insulating layer.

2. The substrate according to claim 1, wherein the organic insulating material has photosensitive properties.

3. The substrate according to claim 2, wherein the organic insulating material includes one of photo-acryl or polyvinylalcohol.

4. The substrate according to claim 1, wherein the inorganic insulating material includes one of silicon oxide or silicon nitride.

5. The substrate according to claim 1, the first gate insulating layer has substantially a same shape as the organic semiconductor layer.

6. The substrate according to claim 1, wherein the transparent conductive material includes one of indium-tin-oxide and indium-zinc-oxide.

7. The substrate according to claim 1, wherein the organic semiconductor layer includes one of pentacene or polythiophene.

8. The substrate according to claim 1, further comprising a passivation layer disposed on the gate line and the gate electrode.

* * * * *